(12) United States Patent
He et al.

(10) Patent No.: US 10,600,636 B2
(45) Date of Patent: Mar. 24, 2020

(54) TOUCH SUBSTRATE AND FABRICATION METHOD THEREOF, AND ELECTRONIC DEVICE

(71) Applicants: BOE TECHNOLOGY GROUP CO., LTD., Beijing (CN); Hefei Xinsheng Optoelectronics Technology Co., Ltd., Anhui (CN)

(72) Inventors: Min He, Beijing (CN); Shifeng Xu, Beijing (CN); Jing Wang, Beijing (CN); Xiaojuan Hu, Beijing (CN); Xiaodong Xie, Beijing (CN); Ming Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 147 days.

(21) Appl. No.: 15/815,749

(22) Filed: Nov. 17, 2017

(65) Prior Publication Data

US 2018/0247807 A1    Aug. 30, 2018

(30) Foreign Application Priority Data

Feb. 27, 2017 (CN) .......................... 2017 1 0108681

(51) Int. Cl.
*H01L 21/027* (2006.01)
*H01L 21/02* (2006.01)
(Continued)

(52) U.S. Cl.
CPC ........ *H01L 21/02107* (2013.01); *G06F 3/044* (2013.01); *G06F 3/0488* (2013.01);
(Continued)

(58) Field of Classification Search
None
See application file for complete search history.

(56) References Cited

U.S. PATENT DOCUMENTS

| 2010/0128000 A1* | 5/2010 | Lo .......................... G06F 3/044 |
| | | 345/174 |
| 2015/0145787 A1* | 5/2015 | Wang ...................... G06F 3/041 |
| | | 345/173 |

(Continued)

FOREIGN PATENT DOCUMENTS

| CN | 102955612 A | 3/2013 |
| CN | 202870776 U | 4/2013 |

(Continued)

OTHER PUBLICATIONS

First Office Action for Chinese Patent Application No. 201710108681.7 dated Apr. 1, 2019.

*Primary Examiner* — Ali Naraghi
(74) *Attorney, Agent, or Firm* — Calfee, Halter & Griswold LLP (57) ABSTRACT

Embodiments of the present disclosure provide a touch substrate and a fabrication method thereof, and an electronic device. The fabrication method of the touch substrate includes: providing a substrate; and sequentially forming a first touch electrode layer, a first insulating layer, a second touch electrode layer and a second insulating layer on the substrate. The first touch electrode layer includes a first touch electrode, and the second touch electrode layer includes a second touch electrode. The step of forming the first insulating layer and the step of forming the second insulating layer are performed by using a single mask.

14 Claims, 4 Drawing Sheets

(51) Int. Cl.
*G06F 3/0488* (2013.01)
*G06F 3/044* (2006.01)
(52) U.S. Cl.
CPC .............. *G06F 2203/04103* (2013.01); *G06F 2203/04112* (2013.01)

(56) References Cited

U.S. PATENT DOCUMENTS

| | | | |
|---|---|---|---|
| 2015/0145816 A1* | 5/2015 | Ueda | C23C 14/083 345/174 |
| 2015/0338953 A1* | 11/2015 | Liu | G06F 3/044 345/174 |
| 2016/0299596 A1* | 10/2016 | den Boer | C03C 17/3671 |
| 2017/0040232 A1* | 2/2017 | Nakayama | H01L 21/30625 |
| 2018/0037004 A1* | 2/2018 | Kim | H01B 1/02 |
| 2018/0247807 A1* | 8/2018 | He | G06F 3/0488 |

FOREIGN PATENT DOCUMENTS

| | | |
|---|---|---|
| CN | 103235659 A | 8/2013 |
| CN | 104007863 A | 8/2014 |
| CN | 104571757 A | 4/2015 |
| CN | 105159515 A | 12/2015 |

* cited by examiner

TOUCH SUBSTRATE AND FABRICATION METHOD THEREOF, AND ELECTRONIC DEVICE

CROSS REFERENCE

The present disclosure claims priority to Chinese Patent Application No. 201710108681.7, filed on Feb. 27, 2017, the entire contents thereof are incorporated herein by reference.

TECHNICAL FIELD

Embodiments of the present disclosure relate to a touch substrate and a fabrication method thereof, and an electronic device.

BACKGROUND

According to different sensing modes, touch panels may be divided into four types, namely resistance-type touch panels, capacitance-type touch panels, infrared touch panels, and acoustic touch panels. The capacitance-type touch panels are widely used due to such advantages as accurate and sensitive in positioning, good in touch feel and long in service life.

A one glass solution (OGS) touch panel and an on cell touch panel are two common touch panels. In the OGS touch panel, a touch structure is arranged on a protective substrate outside a display panel, so that a touch substrate is separately formed, and then the touch substrate and the display panel are laminated together. In the on cell touch panel, the touch structure is arranged on a surface of a side, of a counter substrate (for example, a color filter substrate) in the display panel, away from an array substrate. Whether the OGS touch panel or the on cell touch panel faces problems that development cost is high, technological process is complex, the mask is used for many times, and a bridging contact is poor in visibility.

SUMMARY

According to an aspect of the present disclosure, an embodiment of the present disclosure provides fabrication method of a touch substrate, which includes: providing a substrate; sequentially forming a first touch electrode layer, a first insulating layer, a second touch electrode layer and a second insulating layer on the substrate, wherein the first touch electrode layer includes a first touch electrode, and the second touch electrode layer includes a second touch electrode; and wherein the step of forming the first insulating layer and the step of forming the second insulating layer are performed by using a single mask.

For example, in the fabrication method provided by at least one embodiment of the present disclosure, the first insulating layer is formed using a coating process or an evaporation process, and the first insulating layer is patterned using the mask; and the second insulating layer is formed using the coating process or evaporation process, and the second insulating layer is patterned using the mask.

For example, the fabrication method provided by at least one embodiment of the present disclosure further includes: forming a first conducting wire at least electrically connecting the first touch electrode in an edge region of the substrate.

For example, the fabrication method provided by at least one embodiment of the present disclosure further includes: forming a second conducting wire at least electrically connecting the second touch electrode in the edge region of the substrate.

For example, in the fabrication method provided by at least one embodiment of the present disclosure, before forming the first touch electrode layer, the fabrication method further includes: forming a black matrix in the edge region of the substrate.

For example, in the fabrication method provided by at least one embodiment of the present disclosure, the first touch electrode layer and the second touch electrode layer include at least one of a conductive metal oxide and a conductive metal.

For example, in the fabrication method provided by at least one embodiment of the present disclosure, the touch substrate is fabricated by way of conductive metal oxide bridging, and the mask includes a first region corresponding to an insulating layer of a bridging contact region, a second region corresponding to a black matrix layer, and a hollow area corresponding to a connection portion.

For example, in the fabrication method provided by at least one embodiment of the present disclosure, the touch substrate is fabricated by way of a two-layer conductive metal mesh, and the mask includes a hollow area corresponding to a connection portion.

According to another aspect of the present disclosure, an embodiment of the present disclosure provides a touch substrate, which includes: a substrate; and a first touch electrode layer, a first insulating layer, a second touch electrode layer and a second insulating layer sequentially arranged on the substrate. The first touch electrode layer includes a first touch electrode, and the second touch electrode layer includes a second touch electrode. The first insulating layer and the second insulating layer have the same pattern.

For example, the touch substrate provided by at least one embodiment of the present disclosure further includes a first conducting wire at least electrically connecting the first touch electrode and arranged in an edge region of the substrate.

For example, the touch substrate provided by at least one embodiment of the present disclosure further includes a second conducting wire at least electrically connecting the second touch electrode and arranged in the edge region of the substrate.

For example, the touch substrate provided by at least one embodiment of the present disclosure further includes a black matrix arranged in the edge region of the substrate.

For example, in the touch substrate provided by at least one embodiment of the present disclosure, the first touch electrode layer and the second touch electrode layer include a conductive metal oxide and a conductive metal.

According to still another aspect of the present disclosure, an embodiment of the present disclosure provides an electronic device, which includes any one of the above touch substrates.

BRIEF DESCRIPTION OF THE DRAWINGS

To describe technical solutions of the embodiments of the present disclosure more clearly, the accompanying drawings of the embodiments will be briefly introduced in the following. Apparently, the accompanying drawings in the following description merely involve with some embodiments of the present disclosure, but not limit the present disclosure.

DETAILED DESCRIPTION

To make objectives, technical solutions, and advantages of the embodiments of the present disclosure clearer, the technical solutions of the embodiments of the present disclosure will be clearly and completely described in the following with reference to the accompanying drawings of the embodiments of the present disclosure. Apparently, the described embodiments are some but not all of the embodiments of the present disclosure. All other embodiments obtained by those of ordinary skill in the art based on the described embodiments of the present disclosure without creative efforts shall fall within the protection scope of the present disclosure.

Unless otherwise defined, all the technical or scientific terms used in the present disclosure have the same meanings as commonly understood by one of ordinary skill in the art to which the present disclosure belongs. The terms "first", "second" and so on used in the present disclosure do not denote any sequence, quantity or importance, but instead are merely intended to distinguish different constituent parts. The terms "comprise" or "include" and so on are intended to specify that the elements or the objects stated before these terms encompass the elements or the objects and equivalents thereof listed after these terms, but do not preclude the other elements or objects. The terms "connect" or "connection" and so on are not limited to physical or mechanical connection, and also may include electrical connection, either directly or indirectly. "On," "under," "right," "left" and the like are only used to indicate relative position relationship, and when the absolute position of the object which is described is changed, the relative position relationship may be changed accordingly.

The touch substrate generally includes two layers of touch electrode layers and an insulating layer positioned between the two layers of touch electrode layers. Generally an optical clear adhesive (OCA) is used to fabricate the insulating layer. After the touch electrode layers are formed on the insulating layer, a resin protective layer is fabricated on the touch electrode layers to prevent the touch electrode layers from peeling off or being scratched. Generally, the resin protective layer is fabricated using the optical clear adhesive to optimize production capacity and save process research and development time. For example, the insulating layer fabricated prior using the optical clear adhesive is referred to as an OC1, the resin protective layer fabricated later using the optical clear adhesive is referred to as an OC2, and the two layers of optical clear adhesives are fabricated using the same material. Two different masks are needed because the two layers of optical clear adhesives are different in fabrication requirements.

An embodiment of the present disclosure provides a fabrication method of a touch substrate. The fabrication method includes: providing a substrate; and sequentially forming a first touch electrode layer, a first insulating layer, a second touch electrode layer and a second insulating layer on the substrate. A single mask is employed to pattern so as to form the first insulating layer and the second insulating layer. The first touch electrode layer includes a first touch electrode, and the second touch electrode layer includes a second touch electrode.

In the embodiment of the present disclosure, the single mask is employed to pattern the insulating layer thin film so as to form the first insulating layer and the second insulating layer. In this way, fabrication of one mask may be reduced, so that process cost may be saved and the production efficiency may be increased.

The technical solutions of the present disclosure are described below through a plurality of embodiments.

Figure 1:
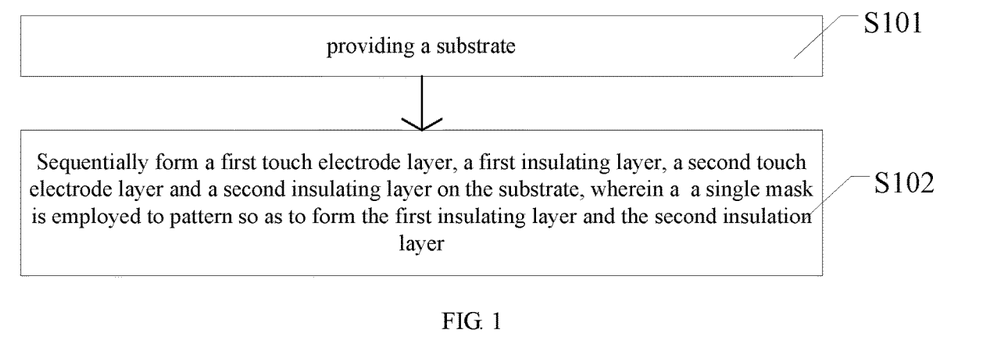
FIG. 1 is a flowchart of a fabrication method of a touch substrate according to an embodiment of the present disclosure.

In some embodiments of the present disclosure, there is provided a fabrication method of a touch substrate. For example, FIG. 1 is a flowchart of a fabrication method of a touch substrate. The fabrication method of the touch substrate includes:

S101: providing a substrate; and

S102: sequentially forming a first touch electrode layer, a first insulating layer, a second touch electrode layer and a second insulating layer on the substrate. The first touch electrode layer includes a first touch electrode, and the second touch electrode layer includes a second touch electrode. The step of forming the first insulating layer and the step of forming the second insulating layer are performed by using a single mask.

For example, a material of the first insulating layer and the second insulating layer may include at least one of silicon oxynitride and silicon dioxide; or the material of the first insulating layer and the second insulating layer includes at least one of silicon oxynitride and silicon dioxide, which is not limited herein. The second insulating layer fabricated using at least one of silicon oxynitride and silicon dioxide may be used as a protective layer of the touch substrate. In this way, anti-ghost of a bridging contact may be avoided, and thus an anti-ghost effect is improved.

For example, the first insulating layer may be formed using a coating process or an evaporation process, and the first insulating layer is patterned using a mask. The second insulating layer is formed using a coating process or an evaporation process, and the second insulating layer is patterned using the mask. Patterning the first insulating layer and the second insulating layer is implemented using the single mask, so that the first insulating layer and the second insulating layer formed in this way have the same pattern. Patterning the first insulating layer and the second insulating layer using the single mask may also reduce fabrication of one mask, so that the process cost may be saved.

For example, the fabrication method further includes: forming a first conducting wire at least electrically connecting the first touch electrode in an edge region of the substrate.

For example, the fabrication method further includes: forming a second conducting wire at least electrically connecting the second touch electrode in the edge region of the substrate.

For example, in the fabrication method provided by this embodiment, before forming the first touch electrode layer, the fabrication method further includes: forming a black matrix in the edge region of the substrate, wherein the formed black matrix is configured to shelter the first conducting wire and the second conducting wire in a bezel region.

For example, the process of forming the black matrix includes: forming a pattern of the black matrix on the substrate by way of patterning processes such as coating, exposing and developing.

For example, in the fabrication method provided by this embodiment, the first touch electrode layer and the second touch electrode layer include at least one of a conductive metal oxide and a conductive metal. At present, schemes of forming the touch substrate may include, for example, a metal oxide bridging scheme and a two-layer metal mesh scheme. When the metal oxide bridging scheme is selected, the first touch electrode layer and the second touch electrode layer are formed using a conductive metal oxide. When the two-layer metal mesh scheme is selected, the first touch electrode layer and the second touch electrode layer are formed using a conductive metal. The two schemes are described respectively in the following.

In some embodiments of the present disclosure, the metal oxide bridging scheme is adopted.

Figure 2A:
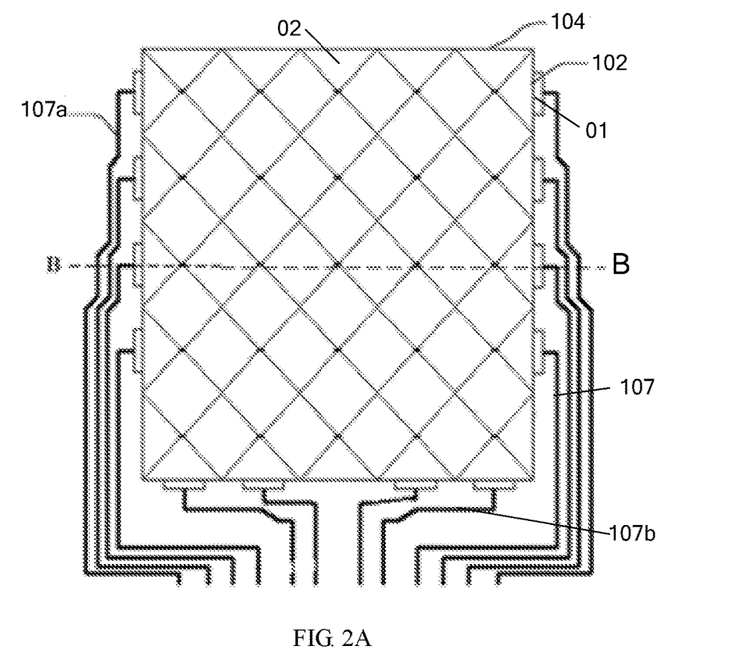
FIG. 2A is a schematic structural diagram illustrating a vertical view of a conductive bridge type touch substrate.

For example, FIG. 2A is a schematic structural diagram illustrating a vertical view of a conductive bridge type touch substrate. As shown in FIG. 2A, the touch substrate includes a first touch electrode layer 01 and a second touch electrode layer 02. The first touch electrode layer 01 includes a plurality of first touch electrodes 102, and the second touch electrode layer 02 includes a plurality of second touch electrodes 104. The plurality of first touch electrodes 102 and the plurality of second touch electrodes 104 are arranged crisscross. Reference is made by taking an example where the first touch electrodes 102 extend along a transverse direction and the second touch electrodes 104 extend along a longitudinal direction. Of course, the directions thereof may be opposite or may be other directions. Each of the first touch electrodes 102 and each of the second touch electrodes 104 are electrically connected to at least one conducting wire 107. That is, the first touch electrode 102 is electrically connected to a first conducting wire 107a, and the second touch electrode 104 is electrically connected to a second conducting wire 107b to implement electrical connection with a touch chip (not shown in FIG. 2A). Patterns of the first touch electrodes 102 include a plurality of rhombic electrode blocks arranged in an array or electrode blocks of any shape arranged in an array. Patterns of the second touch electrodes 104 may be identical to those of the first touch electrodes 102.

Figure 2B:
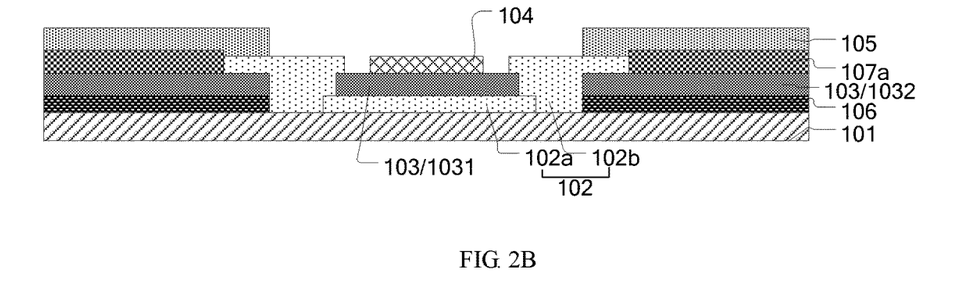
FIG. 2B is a schematic diagram illustrating a cross-section structure of a touch substrate cut along Line BB in FIG. 2A.

Generally, when an OGS touch substrate adopts a conductive bridge type touch structure, a 6-Mask technological process may be used generally, namely, six masks need to be used. FIG. 2B is a schematic diagram illustrating a cross-section structure of a touch substrate cut along Line BB in FIG. 2A. The 6-Mask technological process generally may include:

Step (1): a black matrix layer 106 is fabricated on the substrate 101. For example, the black matrix layer 106 may be obtained by way of patterning processes including adhesive coating, exposing and developing.

Step (2): the first touch electrode layer 01 is fabricated. For example, the first touch electrode layer 01 may include a plurality of conductive bridges 102a arranged at intervals. For example, the first touch electrode layer 01 may adopt a transparent conductive material such as indium tin oxide (ITO) and so on. For example, the first touch electrode layer 01 may be obtained by way of patterning processes including sputter coating, photoresist coating, exposing, developing, etching and photoresist stripping, etc.

Step (3): a first insulating layer 103 is fabricated. The first insulating layer 103 covers the conductive bridges 102a. For example, the first insulating layer 103 may be obtained by way of patterning processes including adhesive coating, exposing and developing.

Step (4): a second touch electrode layer 02 is fabricated. The second touch electrode layer 02 includes a second touch electrode 104 and a plurality of sub-electrodes 102b arranged at intervals. Adjacent sub-electrodes 102b are electrically connected to each other by way of the conductive bridges 102a to form the first touch electrode 102. For example, the second touch electrode layer 02 also may be obtained by way of patterning processes including sputter coating, photoresist coating, exposing, developing, etching and photoresist stripping, etc.

Step (5): a signal transmission layer is fabricated. For example, the signal transmission layer includes a plurality of conducting wires 107. These conducting wires 107 are electrically connected to the first touch electrode 102 and the second touch electrode 104 respectively. FIG. 2 merely illustrates electrical connection between the first touch electrode 102 and the first conducting wire 107a. The electrical connection between the second touch electrode 104 and the second conducting wire 107b is similar to the first touch electrode 102. The signal transmission layer may be fabricated in a way similar to fabricating the first touch electrode layer 01 and the second touch electrode layer 02, which is not unnecessarily elaborated any more herein.

Step (6): a second insulating layer 105 is fabricated. The second insulating layer 105 covers the first conducting wire 107a to protect the first conducting wire 107a. The second insulating layer 105 may be fabricated in a way similar to fabricating the first insulating layer 103.

It is to be noted that the first touch electrode 102 may be used as a touch drive electrode, and the second touch electrode 104 may be used as a touch sensing electrode. Alternatively, the first touch electrode 102 may be used as a touch sensing electrode, and the second touch electrode 104 may be used as a touch drive electrode, which is not limited herein.

As can be seen from FIG. 2B, the sub-electrode 102b is a part of the first touch electrode 102. The sub-electrode 102b and the second touch electrode 104 are formed in the same patterning process.

Figure 2C:
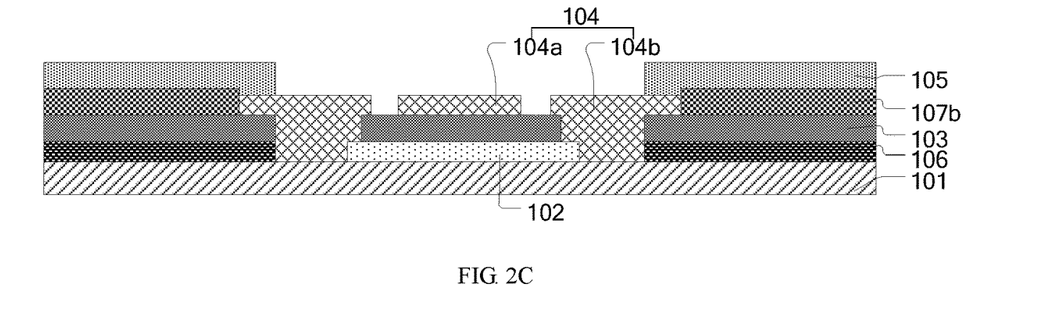
FIG. 2C is a schematic diagram illustrating a cross-section structure of another touch substrate cut along Line BB in FIG. 2A.

For example, FIG. 2C is a schematic diagram illustrating a cross-section structure of another touch substrate cut along Line BB in FIG. 2A. In the cross-section structure as shown in FIG. 2C, the sub-electrode 104b also may be divided into a part of the second touch electrode 104.

Also as can be seen from FIG. 2B and FIG. 2C, the second insulating layer 105 does not cover the conductive bridges 102a and 104a. The first insulating layer 103 includes a first part 1031. The first part 1031 is arranged at a position where the first touch electrode 102 intersects with the second touch electrode 104 and is positioned between the first touch electrode 102 and the second touch electrode 104 to insulate them. The first conducting wire 107a is electrically connected to the first touch electrode 102. The first insulating layer 103 further includes a second part 1032 that is arranged at the same layer with the first part 1031. The second part 1032 covers the black matrix 106, namely, the second part 1032 is arranged above the black matrix 106.

It is to be noted that in the present disclosure the first part 1031 and the second part 1032 are arranged at the same layer, which refers to a fact that the first part 1031 and the second part 1032 are formed by the same film layer. For example, the first part 1031 and the second part 1032 may be formed by first forming an insulating film and then patterning the insulating film. The first part 1031 and the second part 1032 may be separated from each other or may be at least partially connected to each other. In the following embodiments of the present disclosure, "arranged at the same layer" refers to being formed by the same film layer.

For example, the first insulating layer is used for insulating the first touch electrode 102 from the second touch electrode 104 and may protect the first conducting wire from being oxidized or scratched. Materials of the first insulating layer and the second insulating layer may include organic materials such as resin and so on or include inorganic materials such as silicon dioxide, silicon nitride, silicon oxynitride and so on.

For example, materials forming the first conducting wire 107a and the second conducting wire 107b may include alloys formed by at least one or more of metals such as copper, aluminum, magnesium, molybdenum, zirconium, titanium, lead and so on.

For example, materials of the first touch electrode 102 and the second touch electrode 104 may include transparent conductive metal oxides such as at least one of indium tin oxide (ITO), indium gallium zinc oxide (IGZO), indium zinc oxide (IZO) and so on. Except the bridging contact region, the second touch electrode 104 is the same as the first touch electrode in shape, and a projection of each second touch electrode 104 on the substrate 101 may overlap or may not overlap with that of the first touch electrode 102 on the substrate 101.

Figure 3A:
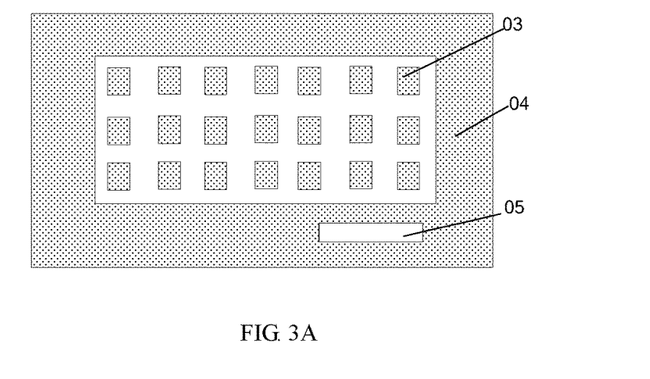
FIG. 3A is a schematic diagram illustrating a plane structure of a first mask used in forming a first insulating layer in FIG. 2A.
Figure 3B:
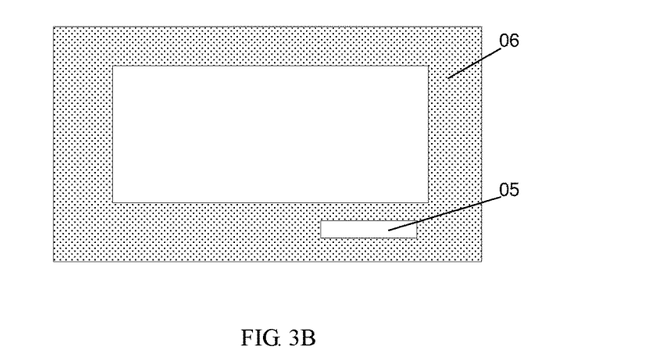
FIG. 3B is a schematic diagram illustrating a plane structure of a second mask used in forming a second insulating layer in FIG. 2A.

FIG. 3A is a schematic diagram illustrating a plane structure of a first mask used in forming a first insulating layer in FIG. 2A, and FIG. 3B is a schematic diagram illustrating a plane structure of a second mask used in forming a second insulating layer in FIG. 2A. As shown in FIG. 3A, the first mask includes a first region 03 corresponding to a bridging contact structure, a second region 04 corresponding to a black matrix layer, and a hollow area 05 corresponding to a connection portion. As shown in FIG. 3B, the second mask includes a third region 06 corresponding to an insulating layer covering a conducting wire, and a hollow area 05 corresponding to a connection portion.

In the study, it is noticed that the third region 06 corresponding to the insulating layer covering the conducting wire is smaller than the second region 04 corresponding to the black matrix layer, thus the second mask used in forming the second insulating layer may be replaced with the first mask. That is, the insulating layer thin film is patterned using the single mask to form the first insulating layer 103 and the second insulating layer 105. In this way, one mask may be saved, and thus the production cost may be reduced. Thus, the mask used in patterning the first insulating layer and the second insulating layer is the mask as shown in FIG. 3A. The mask includes: the first region 03 corresponding to the bridging contact structure, the second region 04 corresponding to the black matrix layer, and the hollow area 05 corresponding to the connection portion.

Figure 4A:
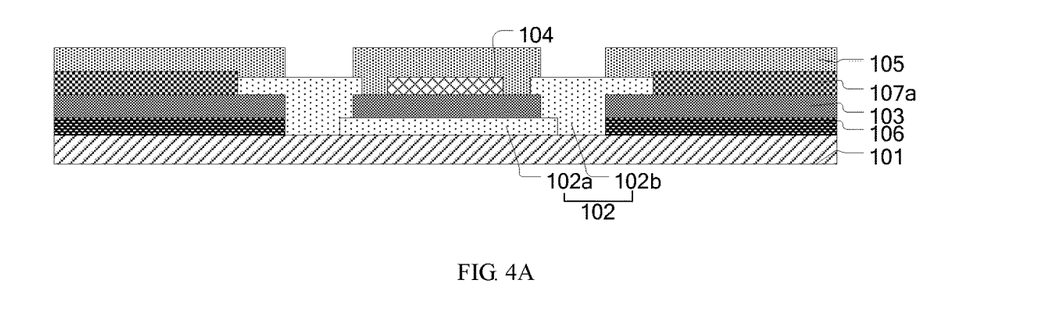
FIG. 4A is a schematic diagram illustrating a cross-section structure of a touch substrate after the first insulating layer and the second insulating layer are formed using a single mask.
Figure 4B:
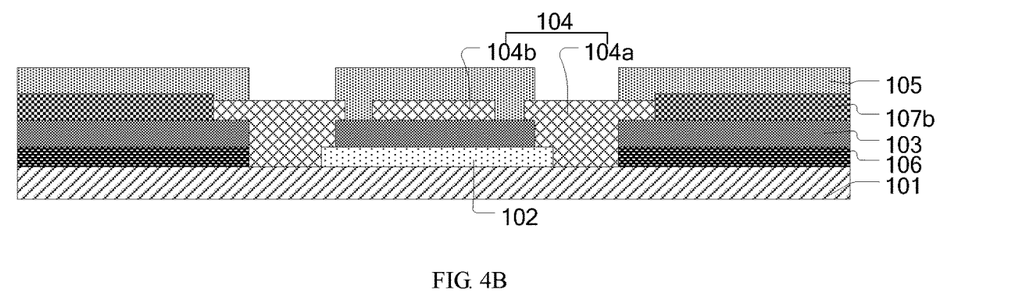
FIG. 4B is a schematic diagram illustrating a cross-section structure of another touch substrate after the first insulating layer and the second insulating layer are formed using a single mask.

FIG. 4A is a schematic diagram illustrating a cross-section structure of a touch substrate after the first insulating layer and the second insulating layer are formed using a single mask, and FIG. 4B is a schematic diagram illustrating a cross-section structure of another touch substrate after the first insulating layer and the second insulating layer are formed using a single mask. As shown in FIG. 4A and FIG. 4B, the black matrix 106, the first touch electrode 102, the first insulating layer 103, the second touch electrode 104, the conducting wire 107 and the second insulating layer 105 are formed on the substrate 101. As can be seen from FIG. 4A, an orthographic projection of the first insulating layer 103 on the substrate overlaps with that of the second insulating layer 105 on the substrate.

In some embodiments of the present disclosure, the two-layer metal mesh scheme is adopted.

Figure 5A:
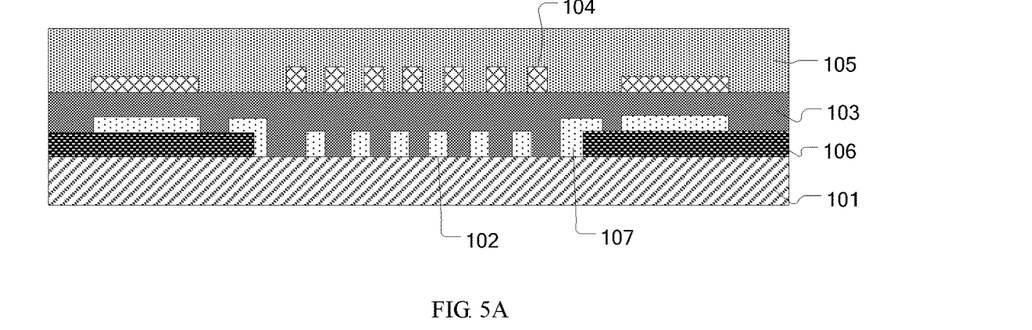
FIG. 5A is a schematic diagram illustrating a cross-section structure of a touch substrate having two-layer metal mesh.

For example, FIG. 5A is a schematic diagram illustrating a cross-section structure of a touch substrate having two-layer metal mesh. As shown in FIG. 5A, the touch substrate includes a first touch electrode 102 and a second touch electrode 104 shaped like metal mesh. Both the first touch electrode 102 and the second touch electrode 104 are electrically connected to at least one conducting wire 107 to implement electrical connection between the first touch electrode 102/second touch electrode 104 and a touch chip.

Generally, when an OGS touch substrate adopts a metal mesh touch structure, 5-Mask technological process may be used generally, namely, five masks need to be used. The 5-Mask technological process generally may include:

Step (1): a black matrix layer 106 is fabricated on the substrate 101. For example, the black matrix layer 106 may be obtained by way of patterning processes including adhesive coating, exposing and developing.

Step (2): a first touch electrode 102 and a first conducting wire 107a electrically connecting the first touch electrode 102 are formed in a region of the black matrix layer 106 of the substrate 101.

Step (3): a first insulating layer 103 is formed above the substrate having the first touch electrode 102 and the first conducting wire 107a.

Step (4): a second touch electrode 104 and a second conducting wire (not shown in FIG. 5A) electrically connecting the second touch electrode 104 are formed on the first insulating layer 103.

Step (5): a second insulating layer 105 is formed above the substrate 101 having the second touch electrode 104 and the second conducting wire.

In the fabrication method of the touch substrate having two-layer metal mesh according to this embodiment, the first touch electrode and the second touch electrode shaped like metal mesh at different layers are formed on the substrate, and the first conducting wire connecting the first touch electrode and the second conducting wire connecting the second touch electrode are formed in a bezel region of the substrate, so that the metal conducting wires are merely positioned in the bezel region, and the first touch electrode and the second touch electrode in a touch region are insulated from each other by means of the first insulating layer. It is unnecessary to design a bridging structure. Thus, the problem of anti-ghost of a bridging contact is avoided, and the design cost is reduced.

Figure 5B:
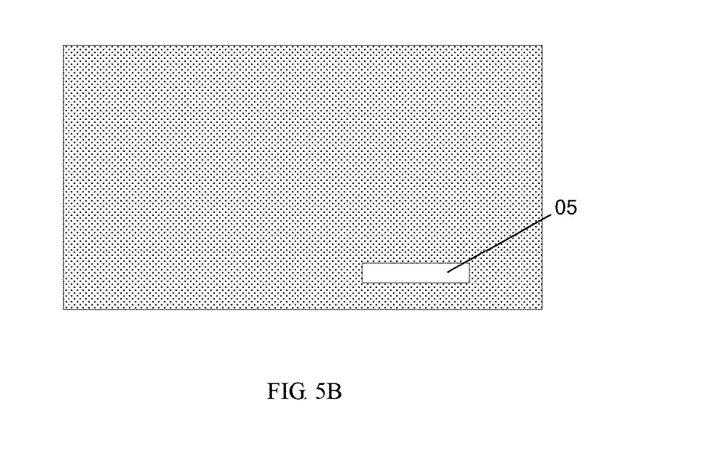
FIG. 5B is a schematic diagram illustrating a plane structure of a mask used in forming the first insulating layer and the second insulating layer in FIG. 5A.

At present, when the touch substrate is formed using the two-layer metal mesh scheme, masks of different sizes are used in the process of fabricating the first insulating layer 103 and the second insulating layer 105. In the study, it is noticed that the first insulating layer 103 and the second insulating layer 105 cover the whole screen. The mask is high in cost and long in fabrication time. Therefore, the same mask may be used when the first insulating layer and the second insulating layer are fabricated. For example, FIG. 5B is a schematic diagram illustrating a plane structure of a mask used in forming the first insulating layer and the second insulating layer in FIG. 5A.

The mask provided by the embodiment of the present disclosure for forming the first insulating layer and the second insulating layer is the same as the mask used at present for forming the first insulating layer 103 in structure. That is, the mask used in this embodiment for forming the first insulating layer and the second insulating layer is the same as the mask used at present for forming the first insulating layer in structure and size. Thus, not only production cost may be saved, but also research and development of products may be accelerated. For example, as shown in FIG. 5B, the mask includes a hollow area 05 corresponding to a connection portion.

For example, materials forming the first touch electrode and the second touch electrode may include alloys formed by at least one or more of conductive metals such as copper, aluminum, magnesium, molybdenum, zirconium, titanium, lead and so on.

Figure 6:
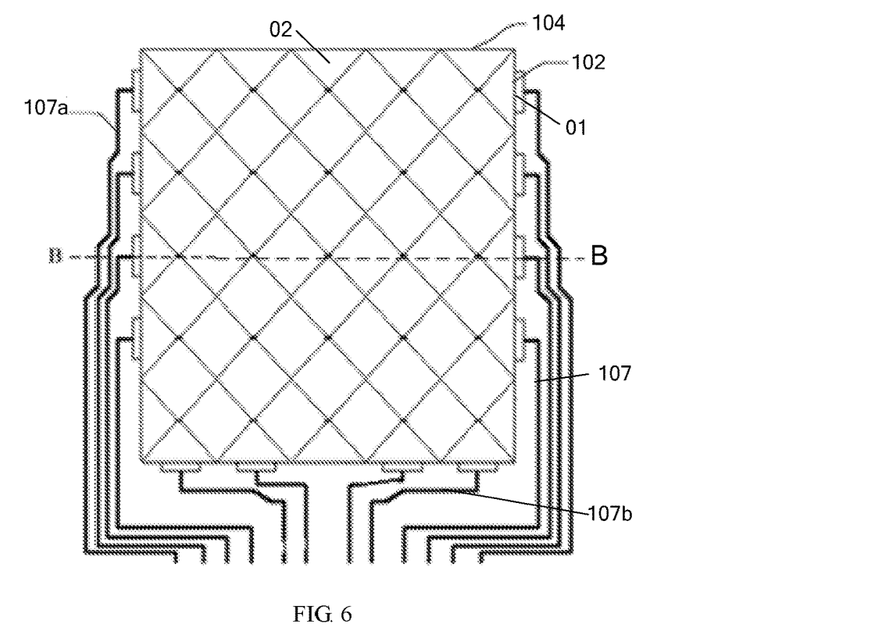
FIG. 6 is a schematic structural diagram illustrating a vertical view of a touch substrate according to an embodiment of the present disclosure.
Figure 7:
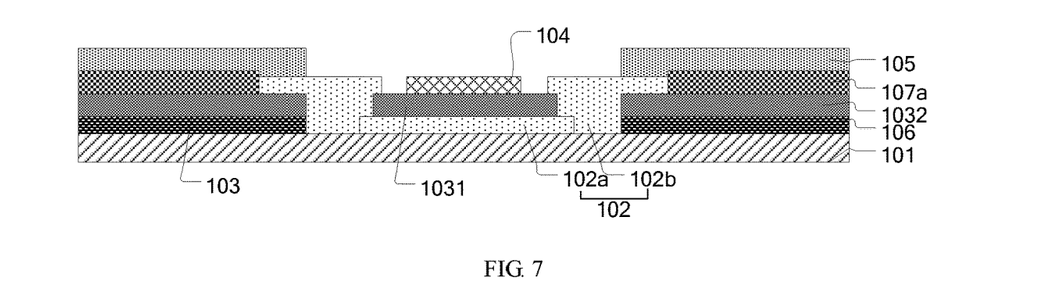
FIG. 7 is a schematic diagram illustrating a cross-section structure of a touch substrate according to an embodiment of the present disclosure.

In some embodiments of the present disclosure, there is provided a touch substrate having a bridging contact structure. For example, FIG. 6 is a schematic structural diagram illustrating a vertical view of a touch substrate according to this embodiment, and FIG. 7 is a schematic diagram illustrating a cross-section structure of a touch substrate according to this embodiment. As shown in FIG. 6 and FIG. 7, the touch substrate includes a substrate 101, and a first touch electrode layer 01, a first insulating layer 103, a second touch electrode layer 02 and a second insulating layer 105 sequentially arranged on the substrate 101. The first insulating layer 103 and the second insulating layer 105 have the same pattern. For example, the first touch electrode layer 01 includes a plurality of first touch electrodes 102, and the second touch electrode layer 02 includes a plurality of second touch electrodes 104. The plurality of first touch electrodes 102 and the plurality of second touch electrodes 104 are arranged crisscross. Reference is made by taking an example where the first touch electrodes 102 extend along a transverse direction and the second touch electrodes 104 extend along a longitudinal direction. The directions thereof may be opposite or may be other directions. Each of the first touch electrodes 102 and each of the second touch electrodes 104 are electrically connected to at least one conducting wire 107. For example, the first touch electrode layer 01 is electrically connected to a first conducting wire 107a arranged in an edge region of the substrate 101, and the second touch electrode layer 02 is electrically connected to a second conducting wire 107b arranged in the edge region of the substrate 101 to implement electrical connection with a touch chip. For example, patterns of the first touch electrodes 102 include a plurality of rhombic electrode blocks arranged in an array or electrode blocks of any shape arranged in an array. Patterns of the second touch electrodes 104 may be identical to or different from those of the first touch electrodes 102.

For example, the touch substrate having a bridging contact structure provided by an example of this embodiment further includes a black matrix 106 arranged in the edge region of the substrate 101.

For example, in the touch substrate provided by this embodiment, materials of the first touch electrode and the second touch electrode may include transparent conductive metal oxides such as at least one of indium tin oxide (ITO), indium gallium zinc oxide (IGZO), indium zinc oxide (IZO) and so on.

For example, the first insulating layer 103 and the second insulating layer 105 have the same pattern. The insulating layer thin film may be patterned using one single mask to form the first insulating layer and the second insulating layer, so that process cost may be saved.

For example, materials of the first insulating layer and the second insulating layer in this embodiment may be either one of silicon oxynitride and silicon dioxide or a combination of both. Alternatively, the materials of the first insulating layer or the second insulating layer may be either one of silicon oxynitride or silicon dioxide or a combination of both, which is not limited herein. The second insulating layer fabricated using silicon oxynitride or silicon dioxide may be used as a protective layer of the touch substrate. In this way, an anti-ghost effect of the touch substrate may be improved. The first insulating layer may insulate the first touch electrode from the second touch electrode, and the second insulating layer may protect the first conducting wire from being oxidized or scratched. Materials of the first insulating layer and the second insulating layer may include organic materials such as resin and so on or include inorganic materials such as silicon dioxide, silicon nitride, silicon oxynitride and so on.

Figure 8:
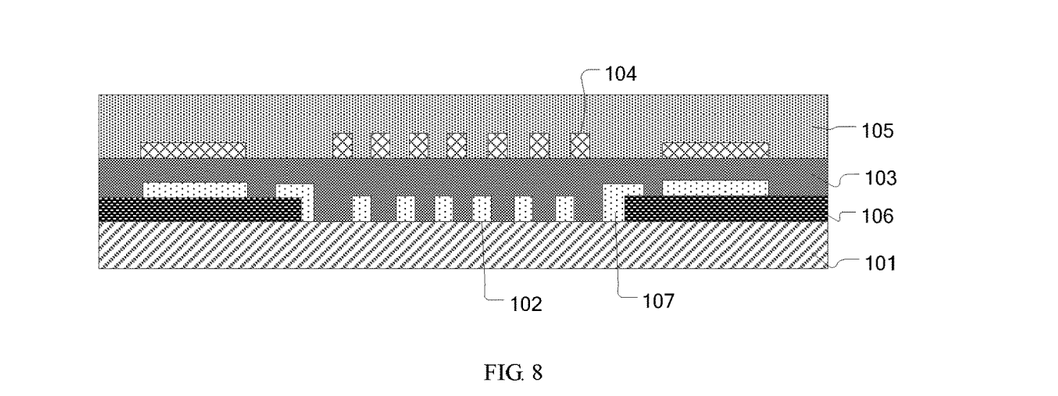
FIG. 8 is a schematic diagram illustrating a cross-section structure of another touch substrate according to an embodiment of the present disclosure.

For example, materials of the first conducting wire and the second conducting wire may include metals, for example, at least one of metals such as copper, aluminum, magnesium, molybdenum, zirconium, titanium, lead and so on, or alloys formed by at least two thereof Some embodiments of the present disclosure also provide a touch substrate having a two-layer metal mesh structure. For example, FIG. 8 is a schematic diagram illustrating a cross-section structure of a touch substrate according to this embodiment. As shown in FIG. 8, the touch substrate includes a substrate 101, and a first touch electrode layer (not shown), a first insulating layer 103, a second touch electrode layer (not shown) and a second insulating layer 105 sequentially arranged on the substrate 101. The first insulating layer 103 and the second insulating layer 105 have the same pattern.

For example, the touch substrate provided by this example further includes a black matrix 106 arranged in the edge region of the substrate 101.

For example, materials forming the first touch electrode and the second touch electrode may include alloys formed by at least one or more of conductive metals such as copper, aluminum, magnesium, molybdenum, zirconium, titanium, lead and so on.

For example, the first insulating layer 103 and the second insulating layer 105 have the same pattern. The insulating layer thin film may be patterned using a single mask to form the first insulating layer and the second insulating layer, so that process cost may be saved.

For example, materials of the first insulating layer and the second insulating layer in this example may be either one of silicon oxynitride and silicon dioxide or a combination of both. Alternatively, the materials of the first insulating layer or the second insulating layer may be either one of silicon oxynitride or silicon dioxide or a combination of both, which is not limited herein. The second insulating layer fabricated using silicon oxynitride or silicon dioxide may be used as a protective layer of the touch substrate. In this way, an anti-ghost effect of the touch substrate may be improved. The first insulating layer may insulate the first touch electrode from the second touch electrode, and the second insulating layer may protect the first conducting wire from being oxidized or scratched. Materials of the first insulating layer and the second insulating layer may include organic materials such as resin and so on or include inorganic materials such as silicon dioxide, silicon nitride, silicon oxynitride and so on.

In some embodiments of the present disclosure, there is provided an electronic device. The electronic device includes the touch substrate according to any one of the above embodiments. For example, the electronic device may include an array substrate and a counter substrate (for example, a color filter substrate) arranged oppositely. The counter substrate may be used as the touch substrate according to any one of the above embodiments. Alternatively, the electronic device may include an array substrate and a counter substrate arranged oppositely as well as a protective substrate arranged at a side, of the counter substrate, away from the array substrate. The counter substrate may be used as the touch substrate according to any one of the above embodiments. The touch panel may be arranged at a side, of the counter substrate, away from the array substrate; or the protective substrate may be used as any touch panel in any one of the above embodiments.

For example, the electronic device may be any product or component having a display function, such as a liquid crystal display panel, an electronic paper display, an OLED panel, a mobile phone, a tablet computer, a TV set, a display, a notebook computer, a digital photo frame, a navigation device and so on.

Embodiments of the present disclosure provide a touch substrate and a fabrication method thereof, and an electronic device. In the fabrication method of the touch substrate, an insulating layer thin film is patterned using a single mask to form a first insulating layer and a second insulating layer. In this way, fabrication of one mask may be reduced, so that process cost may be saved and the production efficiency may be increased.

Following points need to be explained.

The accompanying drawings in the embodiments of the present disclosure are only involved in structures involved in the embodiments of the present disclosure, and reference may be made to typical design. For clarity, in the accompanying drawings for describing the embodiments of the present disclosure, thicknesses of layers or regions are amplified or diminished. That is, these accompanying drawings are not drawn to actual scale. It is to be understood that when an element such as layer, film, region or substrate is referred to as being positioned "on" or "below" another element. The element may be "directly" positioned "on" or "below" the other element, or an intermediate element may be present. The embodiments of the present disclosure and the features in the embodiments may be combined with each other to obtain new embodiments on a non-conflict basis.

The above are merely specific embodiments of the present disclosure, but the protection scope of the present disclosure is not limited thereto. Rather, the protection scope of the present disclosure shall be subject to the protection scope of the claims.

What is claimed is:

1. A fabrication method of a touch substrate, comprising:
   providing a substrate; and
   sequentially forming a first touch electrode layer, a first insulating layer, a second touch electrode layer, and a second insulating layer on the substrate, wherein the first touch electrode layer comprises a first touch electrode, and the second touch electrode layer comprises a second touch electrode; and
   wherein the step of forming the first insulating layer and the step of forming the second insulating layer are performed by using a single mask.

2. The fabrication method according to claim 1, wherein the first insulating layer is formed by using a coating process or an evaporation process, and the first insulating layer is patterned by using the mask; and the second insulating layer is formed by using the coating process or the evaporation process, and the second insulating layer is patterned by using the mask.

3. The fabrication method according to claim 2, wherein before forming the first touch electrode layer, the fabrication method further comprises:
   forming a black matrix in the edge region of the substrate.

4. The fabrication method according to claim 3 wherein the first touch electrode layer and the second touch electrode layer comprise at least one of a conductive metal oxide and a conductive metal.

5. The fabrication method according to claim 4, wherein the touch substrate is fabricated by way of conductive metal oxide bridging, and the mask comprises a first region corresponding to an insulating layer of a bridging contact region, a second region corresponding to a black matrix layer, and a hollow area corresponding to a connection portion.

6. The fabrication method according to claim 4, wherein the touch substrate is fabricated by way of a two-layer conductive metal mesh, and the mask comprises a hollow area corresponding to a connection portion.

7. The fabrication method according to claim 1 further comprising:
   forming a first conducting wire at least electrically connecting the first touch electrode in an edge region of the substrate.

8. The fabrication method according to claim 7 further comprising:
   forming a second conducting wire at least electrically connecting the second touch electrode in the edge region of the substrate.

9. The fabrication method according to claim 8, wherein before forming the first touch electrode layer, the fabrication method further comprises:
   forming a black matrix in the edge region of the substrate;
   wherein the first touch electrode layer and the second touch electrode layer comprise at least one of a conductive metal oxide and a conductive metal.

10. The fabrication method according to claim 9, wherein in case that the touch substrate is fabricated by way of conductive metal oxide bridging, the mask comprises a first region corresponding to an insulating layer of a bridging contact region, a second region corresponding to a black matrix layer, and a hollow area corresponding to a connection portion; and in case that the touch substrate is fabricated by way of a two-layer conductive metal mesh, the mask comprises a hollow area corresponding to a connection portion.

11. The fabrication method according to claim 1, wherein before forming the first touch electrode layer, the fabrication method further comprises:

forming a black matrix in the edge region of the substrate.

12. The fabrication method according to claim 11, wherein the first touch electrode layer and the second touch electrode layer comprise at least one of a conductive metal oxide and a conductive metal.

13. The fabrication method according to claim 12, wherein the touch substrate is fabricated by way of conductive metal oxide bridging, and the mask comprises a first region corresponding to an insulating layer of a bridging contact region, a second region corresponding to a black matrix layer, and a hollow area corresponding to a connection portion.

14. The fabrication method according to claim 12, wherein the touch substrate is fabricated by way of a two-layer conductive metal mesh, and the mask comprises a hollow area corresponding to a connection portion.

* * * * *